United States Patent [19]

Chapelle et al.

[11] Patent Number: 4,669,868
[45] Date of Patent: Jun. 2, 1987

[54] STEP AND REPEAT EXPOSURE APPARATUS AND METHOD

[75] Inventors: Walter Chapelle; Zvi Yaniv; Yair Baron, all of Southfield, Mich.

[73] Assignee: Ovonic Imaging Systems, Inc., Troy, Mich.

[21] Appl. No.: 853,534

[22] Filed: Apr. 18, 1986

[51] Int. Cl.$^4$ ............................................. G03B 27/42
[52] U.S. Cl. ........................................ 355/53; 355/54; 355/95
[58] Field of Search ............................ 355/53, 54, 95

[56] References Cited

U.S. PATENT DOCUMENTS

| | | | |
|---|---|---|---|
| 4,047,813 | 9/1977 | Spence-Bate | 355/95 |
| 4,084,903 | 4/1978 | Pircher | 355/53 |
| 4,362,385 | 12/1982 | Lobach | 355/53 |
| 4,540,277 | 9/1985 | Mayer et al. | 355/53 |

Primary Examiner—Monroe H. Hayes
Attorney, Agent, or Firm—M. S. Siskind; R. M. Goldman

[57] ABSTRACT

An apparatus and method for exposing a film of radiation sensitive material overlying a substrate to a pattern of radiation utilizes proximity focusing of a mask pattern onto the film and step and repeat techniques for exposing the entire area of the film to be exposed. The apparatus includes a source of radiation, a substrate holder supporting the substrate with the film of radiation sensitive material thereon in the path of the radiation, and a mask holder for supporting the mask intermediate the radiation source and the film in close proximity thereto for proximity focusing the mask pattern onto the film. A stepping means incrementally moves the mask relative to the substrate to permit exposure of the film area.

8 Claims, 7 Drawing Figures

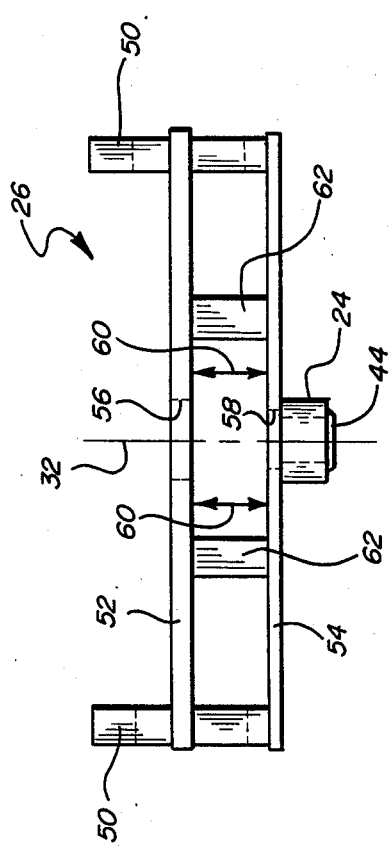
FIG. 2
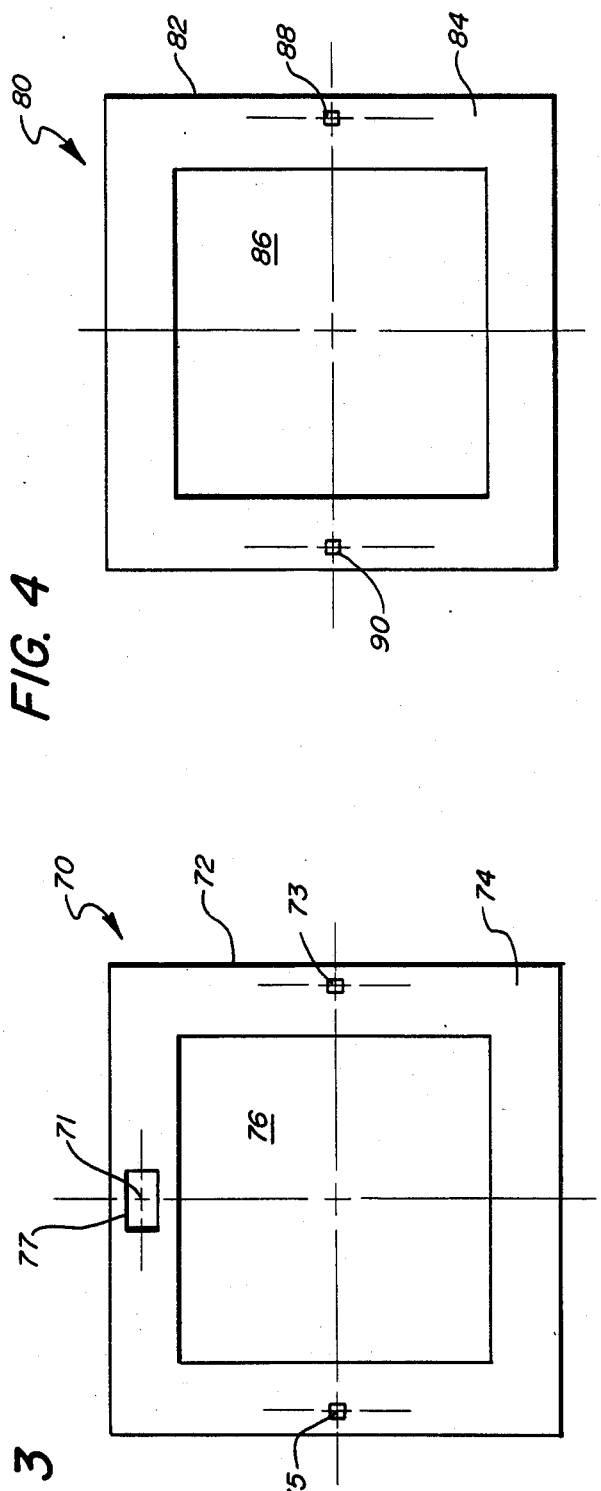
FIG. 4
FIG. 3

STEP AND REPEAT EXPOSURE APPARATUS AND METHOD

BACKGROUND OF THE INVENTION

In the manufacture of integrated electronic devices such as integrated circuits or liquid crystal displays utilizing either direct or active matrix addressing, photolithographic techniques are generally used. Photolithography permits the formation of device elements or structures such as device semiconductor regions, device electrodes, pixel electrodes, and address lines, for example. Photolithography generally entails exposing a film of light sensitive material, such as a photoresist, to a pattern of radiation, such as ultraviolet light, to render the exposed or unexposed film portions soluble to a developer, depending on whether a positive or negative photoresist is utilized. The soluable portions are then selectively removed, for example by etching, to expose selected portions of an etchable layer therebeneath. The etchable layer is then etched in a suitable wet etchant or by a dry etch process, such as by a reactive ion plasma, to form the desired circuit elements from the etchable layer. Because many different kinds of elements make up a finished circuit or display, the photolithography steps must be repeated for many different layers of etchable material. Also, a patterned mask or reticle is often used to derive the pattern of radiation. Hence, many different masks, each corresponding to the pattern of a respective layer, are generally required.

Because photolithographic feature sizes can be rather small in dimension, precision alignment of the various masks for each layer with the patterns of previous layers is absolutely required. The image of the mask which provides the pattern of radiation on the light sensitive film surface must be optically sharp. In accordance with the prior art, there are three basic techniques to facilitate mask alignment and optically sharp exposure.

One such technique is contact printing. Contact printing involves placing a mask in contact with the radiation sensitive film, such as a photoresist, and applying pressure to remove warp effects between the mask and the photoresist. While this can produce excellent focus, the substrate and the mask can be damaged by the contact therebetween and by motion required for aligning the mask with previously patterned layers. In addition, residual substrate material can be transferred to the mask which can cause subsequent printing errors.

Another technique provided by the prior art is proximity printing. In proximity printing, contact damage to the substrate or mask and residual material transfer from the substrate to the mask can be avoided by maintaining a small gap between the adjacent photoresist and mask surfaces during mask alignment and exposure. Proximity printing does not always provide adequate resolution, and experience has shown that the maximum gap is typically 20 to 50 microns assuming the exposing light source is well collimated and the features being exposed are 5 microns in width or larger. This can be a problem, especially for large area applications, where it is difficult to adequately control the flatness of the substrate and the mask.

A further technique known in the art is projection printing. In projection printing, rather expensive projection systems including high cost lenses or spherical mirrors are utilized to insure optimum focusing of an image of the mask onto the photoresist surface. Most lens systems use demagnification and produce very high resolution images over a maximum diameter of only about 1 inch. As a result, step and repeat exposure is generally required for most exposure processes. Spherical mirrors have been made which can expose areas as large as six inches in diameter, but they involve very complex optical and mechanical systems and still require step and repeat operation for large area applications, such as in making liquid crystal displays.

In addition to the foregoing, in projection systems, mercury arc lamps are generally used to provide the required actinic radiation for exposing the photoresist. Such mercury arc lamps provide light at various frequencies known as spectral lines. In projection systems, it is necessary to filter out all of the mercury arc lamp radiation except for one spectral line in order to achieve maximum resolution. Accordingly, a substantial portion of the mercury arc lamp power which would expose the photoresist is filtered out in these systems and not used. As a result, this lenghtens the total amount of time required to properly expose the photoresist.

SUMMARY OF THE INVENTION

The present invention provides an improved apparatus for exposing a film of radiation sensitive material, such as a photoresist, overlying a substrate to a pattern of radiation, wherein the radiation is projected through a patterned mask having an area significantly smaller than the area of the film of radiation sensitive material to be exposed. The apparatus includes a source of the radiation and substrate support means for supporting the substrate with the film of radiation sensitive material thereon in the path of the radiation. A mask holder means supports the mask in an intermediate position between the radiation source and the film and in close proximity to the film for proximity focusing the mask pattern onto the film. The apparatus further includes stepping means for incrementally moving the mask relative to the substrate to permit exposure of the film area.

The present invention further provides a method of exposing a film of radiation sensitive material, such as a photoresist, overlying a substrate to a pattern of radiation, wherein a patterned mask having an area significantly smaller than the area of the film of radiation sensitive material is utilized. The method includes the steps of providing a source of the radiation, supporting the substrate with the film of radiation sensitive material thereon and in the path of the radiation, supporting the mask between the radiation source and the film and in close proximity to the film to proximity focus the mask pattern onto the film, and incrementally moving the mask relative to the substrate to expose the film area with the pattern of radiation.

BRIEF DESCRIPTION OF THE DRAWINGS

FIG. 2 is a front plan view of the mask holder support and mask holder of the apparatus of FIG. 1;

FIG. 3 is a plan view of a mask which may be utilized in practicing the present invention;

FIG. 4 is a plan view of another mask which may be utilized in practicing the present invention;

DETAILED DESCRIPTION

Figure 1:
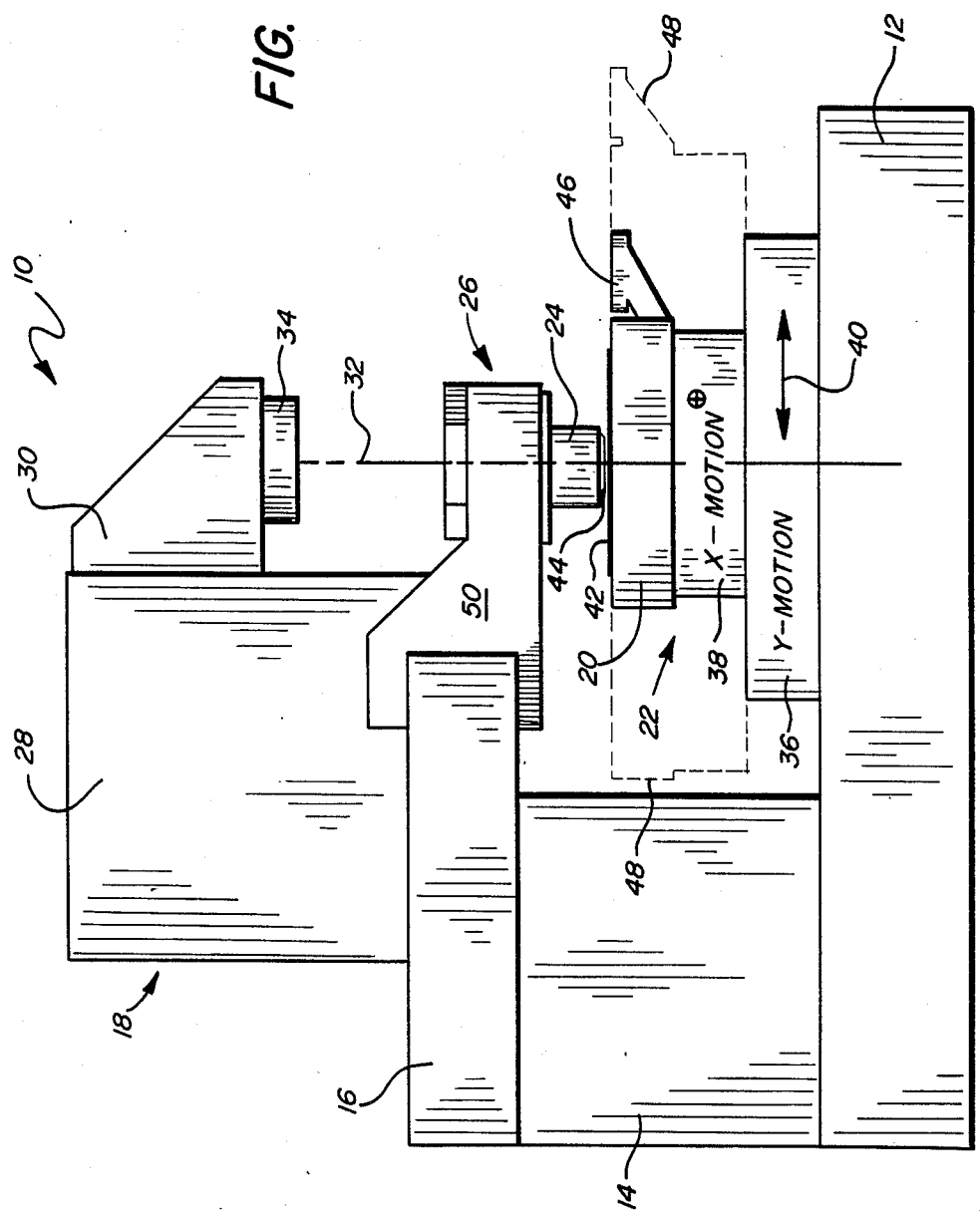
FIG. 1 is a side plan view of an exposure apparatus embodying the present invention.

Referring now to FIG. 1, it illustrates an exposure apparatus 10 embodying the present invention. The apparatus 10 generally includes a base 12, a riser 14, an upper table 16, and a source of radiation such as a high pressure mercury arc source 18. The apparatus 10 further includes a substrate holder 20, a substrate translation stage 22, a mask holder 24, and a mask holder support 26.

The base 12 is preferably formed from a dense material, such as granite, and is dimensioned to extend laterally beyond any of the other components of the apparatus to establish the major lateral dimensions of the apparatus 10. The base 12 is also relatively thick in dimension. The dimensions of the base 12 and the material from which it is formed assures that the base is the component part of the apparatus of greatest weight lending stability to the apparatus commensurate with the precision required by photolithographic applications.

The riser 14 extends upwardly from the base 12 and supports the upper table 16. The upper table 16 extends beyond the riser and supports the mask holder support 26 which carries the mask holder 24.

The source of radiation 18 is disposed upon the upper table 16 and includes a first housing 28 in which a high pressure mercury arc source is disposed. The source of radiation 18 includes a second housing 30 wherein mirrors are disposed for projecting the desired radiation, such as ultraviolet light, along a path indicated at 32 through a collimating system 34.

As will be described subsequently, the apparatus 10 utilizes proximity focusing for focusing an image of a mask onto the light sensitive film of material such as a photoresist. As a result, all of the spectral lines of radiation from the source 18 to which the photoresist is sensitive can be utilized, negating the need to filter out all of the spectral lines except for one spectral line. Since radiation energy is not lost, as in projection systems, the apparatus of the present invention reduces the total amount of time required to properly expose the photoresist. This materially contributes to the speed in which the photoresist material can be developed.

The substrate holder 20 is disposed upon the substrate translator 22. The substrate translator 22 includes a first stage 36 and a second stage 38. The stages 36 and 38 preferably comprise roller-bearing or air-bearing slides to impart linear movement to the substrate holder 20 in first and second directions which are perpendicular to one another. For example, the stage 36 can be arranged to impart movement to the substrate holder 20 in the direction indicated by the arrow 40 and the stage 38 can impart motion to the substrate holder 20 in a direction perpendicular thereto.

The substrate holder 20 is disposed upon the substrate translator 22 and is arranged for receiving a substrate 42 thereon. Preferably, the substrate holder 20 includes a vacuum chuck (not shown) which exerts vacuum pressure against the substrate 42 placed thereon for securely holding the substrate 42 in place upon the substrate holder 20. The substrate holder 20 can also include a plurality of pins (not shown) on its upper surface which project upwardly to define the edges of the substrate 42 for repeatably locating the substrate 42 on the vacuum chuck. As can be noted from the figure, the substrate holder 20 is positioned so that the substrate 42 and the photoresist film thereon is supported in the path 32 of the ultraviolet light.

The substrate holder 20 also preferably includes an internal mechanism for rotating the substrate plus or minus one degree. This allows the substrate to be aligned with the x-y axis of the mask. The substrate holder also preferably includes an internal tilting or leveling mechanism. This allows the top surface of the substrate to be disposed substantially parallel to the mask to compensate for variations in substrate thickness across the substrate.

The mask holder support 26 extends from the upper table 16 over the substrate holder 20. The mask holder support 26 carries the mask holder 24 in a position above the substrate holder 20 so that a mask 44 held by the mask holder will also be in the path 32 of the ultraviolet light. Also, the mask 44 is held by the mask holder 24 in close proximity to the photoresist film upon the substrate 42 so that the pattern of the mask is proximity focused onto the substrate 42.

As will be described subsequently in greater detail, the mask holder 24 also preferably includes a vacuum chuck for holding the mask 44 securely in place. A mask shelf 46 extends from the substrate holder 20 and is arranged to temporarily receive or hold a mask thereon to be utilized in the photolithographic process. In loading a mask, a mask can be placed upon the shelf 46 and the substrate translator 22 actuated to move the mask to a position underneath the mask holder 24 whereupon the vacuum chuck will pick up the mask and hold it securely in place thereon.

The substrate translator 22 is provided with sufficient travel as indicated by the dashed lines 48 to permit the entire surface of the substrate 42 to be incrementally moved under the mask 44 so as to enable exposure of the entire photoresist film surface with the pattern of radiation defined by the mask 44. Hence, in order to expose the entire surface of the photoresist upon substrate 42, the substrate 42 is moved incrementally or stepped by the substrate translator 22 under the mask 44 in a step and repeat process to provide complete exposure of the photoresist area. Such step and repeat processing is required because proximity focusing is utilized and because the mask pattern area is significantly smaller than the area of the photoresist to be exposed. For example, the patterned mask area can be three inches by three inches in dimension and the photoresist can have an area of twelve inches by twelve inches. As a result, sixteen incremental steps would be required to expose the entire surface area of the photoresist. The substrate translator 22 also provides sufficient travel to permit substrate loading and unloading without interferring with the mask holder 24.

Referring now to FIG. 2, it illustrates the mask holder support 26 in greater detail. The mask holder support 26 includes a pair of arms 50 which extend from the upper table 16 and support the mask holder 24 over the substrate holder 20 as shown in FIG. 1. Extending transversely with respect to the arms 50 are a pair of transverse members 52 and 54. The transverse members 52 and 54 each include an opening 56 and 58 respectively so as to not disrupt the path of light 32. As can be noted in FIG. 2, the transverse member 54 is thinner in dimension than the transverse member 52. As a result, the transverse member 54 will have greater flexibility than the transverse member 52. The greater flexibility of the transverse member 54 is utilized to advantage to impart vertical movement to the substrate holder 24 for adjusting the proximity gap between the mask 44 and the film of photoresist covering the substrate 42. Vertical movement is imparted to the mask holder 24 and thus the mask 44 by applying a force between the transverse members 52 and 54 as indicated by the arrows 60. To exert the force between the transverse members, linear actuators 62 are provided. The linear actuators 62 can take the form of piezoelectric translators which extend between the transverse members 52 and 54 to exert a force therebetween responsive to the receipt of electrical current. The linear actuators 62 are spaced from the center of the transverse members 52 and 54 by an equal distance so that uniform vertical displacement is imparted to the substrate holder 24 when pressure is applied between the transverse members 52 and 54 by the transducers 62.

Piezoelectric translators are particularly well suited for this application because these devices are high resolution linear actuators capable of accurately positioning the holder 24 over a range of fifty microns. One such piezoelectric translator which can be used is the Burleigh piezoelectric transducer Model No. IW-602 referred to as the "inch-worm".

Referring now to FIG. 3, it illustrates a mask 70 which can be utilized in practicing the present invention. The mask 70 is formed of a glass substrate 72 having a marginal portion covered with an opaque material, such as chromium, which defines an inner effective mask pattern area 76. The area 76 preferably includes a mask pattern which, when stepped and repeated across the photoresist of the substrate 42 of FIG. 1, will provide a complete pattern which has been exposed to the ultraviolet light. Within a portion 77 of the marginal portion 74 there is formed a substrate alignment mark pattern 71. The substrate alignment mark pattern 71 within the portion 77 is formed for the purpose of aligning subsequent masks to previously patterned layers. As a result, the mask 70 can be utilized as the first mask of a multiple mask set for patterning the first layer on the substrate 42.

Also formed within the marginal portion 74 are a pair of mask reference marks 73 and 75. The mask reference marks 73 and 75 are used for initially aligning the mask 70 when it is picked up by the holder 24. The mask 70 is aligned by identifying the location of the marks 73 and 75 to determine the x and y axes of the mask. As a result, the x and y position of the mask and the relative rotation of the mask with respect to the relative translator 22 can be determined. Accordingly, the determined mask position can then be used as a reference to establish the angle of the substrate holder.

FIG. 4 illustrates another mask 80 which can also be used in practicing the present invention. The mask 80 is of the type which can be utilized for patterning subsequent layers after the first layer has been patterned utilizing the mask 70 of FIG. 3. Like the mask 70, the mask 80 is formed of glass 82 and includes a marginal portion 84 formed of chromium, for example, which defines an inner effective mask pattern area 86. Within the marginal portion 84 are formed a pair of mask reference marks 88 and 90 which, in addition to providing a means for determining the x and y axes of the mask, can be utilized for locating the substrate alignment mark pattern 71 formed in the first layer on the substrate for the purpose of aligning the mask area 86 with the previously formed layer patterns.

Figure 5:
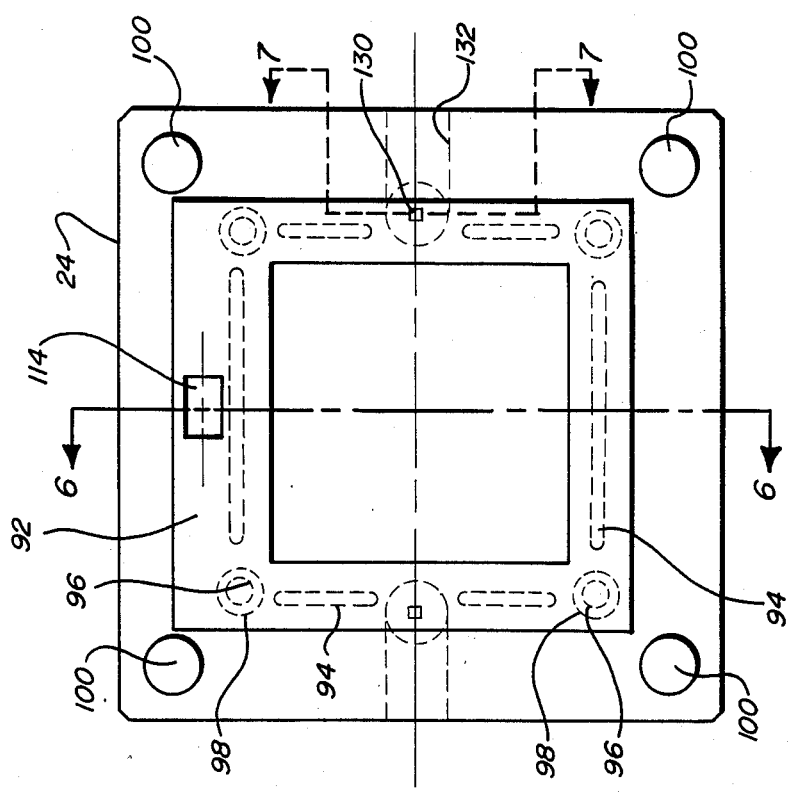
FIG. 5 is a bottom plan view of the mask holder of FIG. 1.

Referring now to FIG. 5, it illustrates, in plan view, the bottom of the substrate holder 24. The substrate holder 24 includes a vacuum chuck 92 which includes a plurality of elongated orifices 94 through which a vacuum is formed for the purpose of holding a substrate, such as the substrates 70 and 80 illustrated in FIGS. 3 and 4 in place. In addition to the orifices 94, the vacuum chuck includes apertures 96. Each of the apertures 96 has an O ring 98 associated with it to provide an initially soft surface for contacting The masks as they are drawn to the mask holder and held in place therein.

The mask holder 24 further includes an air gauge 100 at each corner of the mask holder 24. The air gauges 100 are of the type well known in the art and are utilized for measuring the proximity gap or, in other words, the spacing between the mask and the substrate.

The air gauges are also used to measure any tilt between the substrate 42 and the masks. This is preferably done prior to the step and repeat process. The tilt can be corrected by leveling means contained within the substrate holder 20 as previously mentioned. Because a plurality of air gauges are placed around the perimeter of the mask holder, the proximity gap can be measured at several points adjacent to the mask. The average of these measurements can then be used to adjust the gap in order to minimize the loss of focus due to fluxuations in substrate thickness. Also the probability of contact between the mask and substrate can be minimized.

Frequent spacing measurements are preferred due to variations in the thickness of glass substrates. For example, substrates of eleven inches by eleven inches in dimension and having a nominal thickness of one millimeter, formed of even expensive stock, can vary in thickness by as much as plus or minus fifty microns. Less expensive substrate stock can have even greater variations. Thus, it is preferred that frequent gap or spacing measurements and adjustments be made during the step and repeat process.

Figure 6:
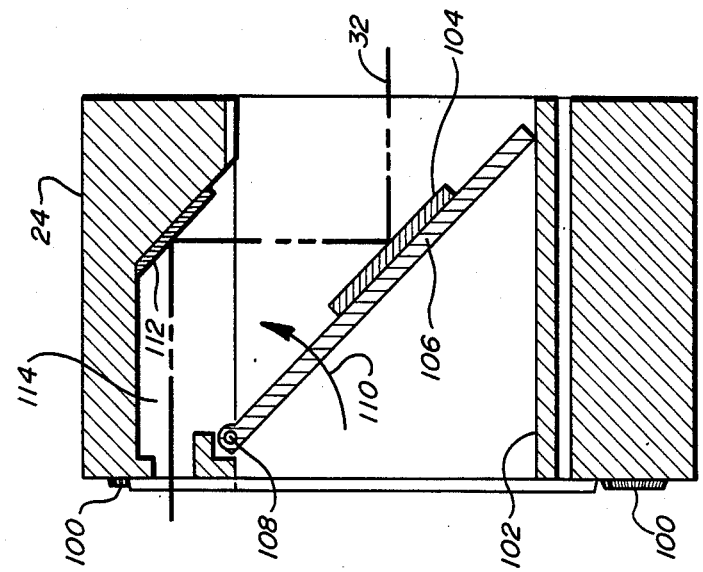
FIG. 6 is a cross-sectional side view taken along lines 6—6 of FIG. 5 illustrating one feature of the mask holder of the exposure apparatus of the present invention.

As can be noted in the cross-sectional view of FIG. 6, the mask holder 24 further includes a through bore 102 which is dimensioned in general correspondence to the effective pattern area of the masks. The through bore 102 permits the ultraviolet light to fully and uniformly illuminate the effective patterned mask area for providing a pattern of the ultraviolet light radiation which is proximity focused onto the photoresist covering the substrate.

As can also be noted in FIG. 6, the mask holder 24 includes a mirror 104 which is carried by a pivot arm 106. The arm 106 is connected to a pivot point 108 and is movable in a direction indicated by the arrow 110. The mirror 104 together with another mirror 112 serves to divert the light path through a side channel 114 for the purpose of exposing the alignment mark pattern provided by the first mask 70 of the mask set. After the alignment mark pattern is exposed, the mirror and pivot arm 106 move in the direction of the arrow 110 out of the light path 32 to permit exposure of the photoresist to the mask pattern.

Figure 7:
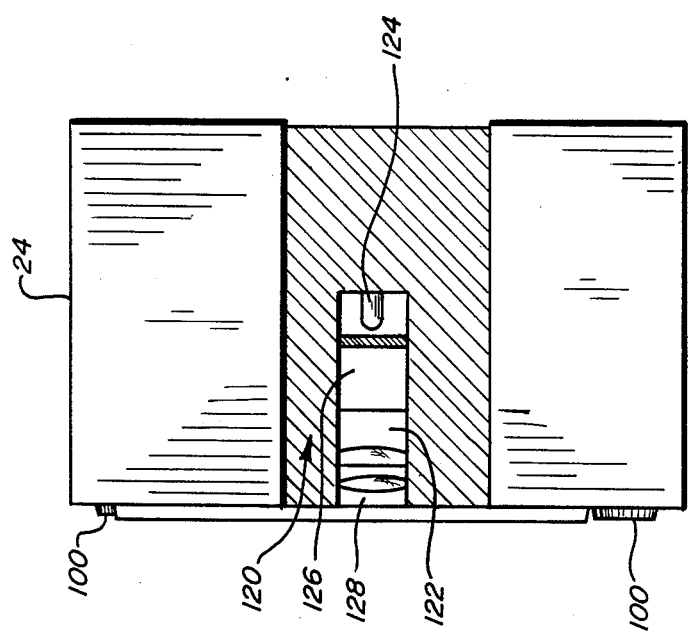
FIG. 7 is a partial cross-sectional side view taken along lines 7—7 of FIG. 5 illustrating another feature of the mask holder of the exposure apparatus of the present invention.

Referring now to FIG. 7, it illustrates the structure of the mask holder 24 which can be utilized for locating the alignment mark pattern formed by the first mask for the purpose of aligning subsequent masks to each of the previously formed patterns. The alignment mark pattern locating means 120 includes a channel 122 having disposed therein a light source such as a light emitting diode 124, a mirror 126, and a lens system 128. The lens system 128 serves to focus the light provided by the light emitting diode 124 onto a mask reference mark through a corresponding opening 130 which is positioned to be aligned with the mask reference marks of the mask when the masks are held in place within the mask holder. The mirror 126 is of the beam splitter type which permits the light from the light emitting diode 124 to pass therethrough and to be focused by the lens system 128 onto the mask reference marks. The mask reference mark can then be roughly aligned with the substrate alignment mark pattern 71 and their combined image is then reflected back through the lens system 128 to the mirror 126. The mirror 126 is preferably disposed at an angle of approximately 45° with respect to the path of light provided by the light emitting diode 124 for projecting the combined image through a side channel 132 of the mask holder 24 as can be best seen in FIG. 5. The combined image of the mask reference mark and the substrate alignment mark pattern can then be detected with an electronic camera. Thereafter, an automated digital image processor can be used to align the mask reference mark and the substrate alignment mark pattern into direct coincidence.

When aligning the mask reference marks with the substrate alignment mark pattern the light emitting diode is preferably pulsed or turned on briefly to avoid heating the mask, substrate or the other components of the system. Also, it is preferred that the light emitting diode emit visible red light so as not to expose the photoresist during the alignment process.

As can be noted in FIG. 5, two such alignment mark pattern locating means are provided on opposite sides of the mask. This enables the substrate alignment mark pattern to be located on one side of the mask and then located on the opposite side of the mask to assure proper alignment. If the substrate alignment mark pattern is not in alignment on the opposite side of the mask, rotation of the substrate relative to the mask is required to provide proper angular mask alignment.

In utilizing the apparatus of FIG. 1, the substrate translator 22 is actuated to cause the substrate holder 20 to move to the right by its greatest extent. A mask is then placed onto the mask shelf 46. The substrate translator 22 then moves the mask towards the left until the mask is located immediately beneath the mask holder 24. The vacuum suction provided by the orifices 94 and apertures 96 of the mask holder vacuum chuck then draw the mask up against the mask holder into place and holds it firmly thereon. Then, by utilizing the pair of mask reference marks, the x-y axis of the mask is determined.

With the mask now in place and after its x-y axis is determined, the holder 20 is again actuated to move to the right by its greatest extent to permit the loading of a substrate 42 onto the substrate holder 20. When the substrate is placed onto the substrate holder 20, it is positioned by the pins thereon previously referred to. The vacuum chuck within the substrate holder 20 then holds the substrate firmly in place.

The substrate 42 is then leveled by measuring the spacing between the substrate 42 and the mask by utilizing the air gauges at the four corners of the mask holder. As previously mentioned, the substrate can be leveled by using leveling means within the mask holder 20. Such substrate leveling means can include a tilting mechanism to tilt the vacuum chuck within the substrate holder 20 to remove substrate wedge effects and other height errors.

If the first layer is being applied, the mirror 104 is moved into position as illustrated in FIG. 6. The substrate is then moved so that the alignment mark of the mask overlies the substrate at a predetermined known location. The spacing between the mask and the substrate 42 is then measured with the air gauges and adjusted so as to proximity focus the substrate alignment mark pattern onto the photoresist. Then, the light source is energized to expose the alignment mark pattern onto the photoresist. Then, the mirror and pivot arm 106 are moved into its position out of the path of light. The mask is then moved to an initial position wherein the step and repeat process begins. During the step and repeat process, the substrate translator 22 incrementally moves the substrate relative to the mask holder by incremental distances equal to the dimension of the mask. With each incrementation, the substrate is temporarily held stationary to permit leveling adjustments and exposure of the mask pattern.

After the first mask has exposed the entire area of the substrate to be exposed, the substrate is removed and is treated in a manner well known in the art for developing the photoresist and etching the desired pattern left in the photoresist within the etchable layer therebeneath.

After the first layer has been patterned on the substrate, a second layer or plurality of layers of etchable material are formed over the substrate and then patterned by the use of a second mask. For masks utilized subsequent to the first mask, these masks are loaded onto the mask holder in the same manner as previously described. Again, the leveling of the substrate is checked and corrected if necessary. Then, the mask reference marks are utilized together with the substrate alignment mark pattern formed by the first mask for the purpose of rotating the substrate into proper x-y alignment with the previously formed mask patterns. During the alignment and exposing process, the spacing between the mask and substrate is rechecked and adjusted to proximity focus the new pattern onto the substrate at each position. Then the substrate is moved to a starting position whereat the step and repeat process once again begins as previously discussed.

As can be appreciated by those skilled in the art, the step and repeat process can be performed under software control for establishing the initial position of the substrate relative to the mask upon the initiation of the step and repeat process. Software control can also be utilized for measuring the proximity gap spacing to assure proper proximity focusing of the mask patterns.

By utilizing proximity printing in combination with step and repeat techniques as disclosed herein, an apparatus for conducting photolithographic exposure and mask alignment with sufficient resolution for many applications, such as liquid crystal display applications results which exhibits high productivity and less complexity than previous projection systems. Because a mask exposure area of two inches by two inches or larger can be utilized as compared to exposure areas of 0.8 inch by 0.8 inch for projection steppers, a large area can be exposed in fewer incrementation steps. As an example, for a six inch by 10 inch area to be exposed, only 15 steps are required in accordance with the present invention as compared to approximately 104 steps by utilizing prior art projection printing and step and repeat techniques. In addition, experience has shown, that with the higher energy exposing radiations made possible by the proximity focusing of the present invention, about twenty seconds during each exposure can be saved. Also since the load, unload, alignment and exposure functions typically take about ninety seconds, the time saved in exposing one substrate is significant.

We claim:

1. An apparatus for exposing a film of radiation sensitive material overlying a substrate to a pattern of radiation, wherein said radiation is projected through a patterned mask having an area significantly smaller than the area of said film of radiation sensitive material to be exposed, said apparatus comprising:

a substrate with a substantially planar film of radiation sensitive material thereupon;

a source of radiation;

means for supporting said substrate in the path of said radiation;

a patterned substantially planar mask;

holder means for supporting said mask between said radiation source and said film and in close proximity to said film for proximity focusing said mask pattern onto said film;

gap means for adjusting the spacing between said mask and said film;

leaving means for spacedly maintaining said mask and said film in substantially parallel relation to each other;

means for exposing at least one alignment mark on said film so as to align subsequent masks with said mask pattern, said exposing means utilizing the same source of radiation for exposing said alignment masks; and said exposing means including movable means for diverting radiation from said path to a marginal side portion of said mask;

alignment mark locating means for appropriately locating subsequent masks with respect to said alignment mark;

control means for rotating said substrate and said mask relative to each other; and stepping means for incrementally moving, in first and second perpendicular linear directions, said mask and said substrate relative to each other to permits exposure of the entirety of the area of said film of radiation sensitive material.

2. Apparatus as defined in claim 1 wherein said holder means includes vacuum means for holding said mask in place.

3. Apparatus as defined in claim 1, wherein said support means includes vacuum means for holding said substrate in place.

4. Apparatus as defined in claim 1, wherein said gap adjusting means includes mask holder moving means for displacing said mask towards or away from said film.

5. Apparatus as defined in claim 4 wherein said mask holder moving means comprises at least one flexible support member coupled to said mask holder means, said flexible support member extending transversely to said radiation path; and further including means for flexing said flexible support member.

6. Apparatus as defined in claim 1, further including air guage means for measuring the gap between said film and said mask.

7. Apparatus as defined in claim 6 wherein said air guage means is disposed within said mask holding means.

8. Apparatus as defined in claim 1 wherein said alignment mark locating means includes means for projecting light onto a mask reference mark in a marginal portion of said subsequent masks to permit the alignment of said alignment mark with said mask reference mark.

* * * * *